(12) United States Patent
Chang et al.

(10) Patent No.: US 9,893,184 B2
(45) Date of Patent: Feb. 13, 2018

(54) FIN-TYPE FIELD EFFECT TRANSISTOR DEVICE AND METHOD OF FABRICATING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/968,920

(22) Filed: Dec. 15, 2015

(65) Prior Publication Data

US 2017/0170316 A1    Jun. 15, 2017

(51) Int. Cl.
| H01L 29/78 | (2006.01) |
| H01L 29/66 | (2006.01) |
| H01L 29/06 | (2006.01) |
| H01L 29/08 | (2006.01) |
| H01L 23/535 | (2006.01) |
| H01L 21/768 | (2006.01) |

(52) U.S. Cl.
CPC ...... *H01L 29/7848* (2013.01); *H01L 21/7684* (2013.01); *H01L 21/76895* (2013.01); *H01L 23/535* (2013.01); *H01L 29/0653* (2013.01); *H01L 29/0847* (2013.01); *H01L 29/66795* (2013.01); *H01L 29/7851* (2013.01)

(58) Field of Classification Search
CPC ............ H01L 29/7848; H01L 29/0653; H01L 29/0847; H01L 29/66795; H01L 29/7851
See application file for complete search history.

(56) References Cited

U.S. PATENT DOCUMENTS

| 9,230,816 B1 * | 1/2016 | Hung ............... H01L 21/28518 |
| 2002/0140101 A1 * | 10/2002 | Yang ............... H01L 21/76802 257/762 |
| 2005/0253193 A1 * | 11/2005 | Chen .................... H01L 29/665 257/347 |
| 2006/0046401 A1 * | 3/2006 | Kavalieros ........ H01L 21/28114 438/283 |
| 2008/0083955 A1 * | 4/2008 | Kanarsky .......... H01L 21/76829 257/382 |
| 2015/0162332 A1 * | 6/2015 | Kim .................. H01L 29/66545 257/401 |

* cited by examiner

*Primary Examiner* — Matthew Reames
(74) *Attorney, Agent, or Firm* — JCIPRNET

(57) ABSTRACT

In accordance with some embodiments of the present disclosure, a fin-FET device includes a substrate, a stack structure, a source and drain region, a sidewall insulator and a metal connector. The stack structure including a gate stack is disposed on the substrate. The source and drain region is disposed beside the stack structure. The sidewall insulator is disposed on the source and drain region. The sidewall insulator includes a bottom portion and an upper portion. An interface is formed between the bottom portion and the upper portion and the bottom portion is located between the upper portion and the source and drain region. The metal connector stacks on the source and drain region and the sidewall insulator is located between the metal connector and the stack structure.

18 Claims, 4 Drawing Sheets

FIN-TYPE FIELD EFFECT TRANSISTOR DEVICE AND METHOD OF FABRICATING THE SAME

BACKGROUND

Following the increasing needs for smaller electronic devices, devices with three dimensional (3D) structures have been developed. An example of such devices includes fin-type electric field transistors (FinFETs) having elevated fin-like structures vertically on substrate. It is desirable to maintain the yield and the performance of the devices for the devices with complex topographical structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
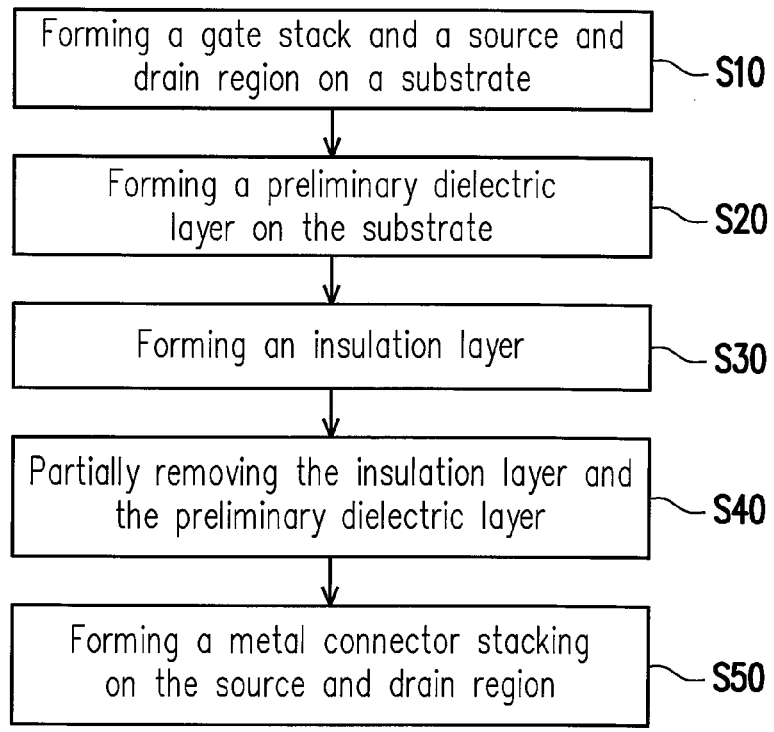
FIG. 1 schematically illustrates a flow chart of a method of fabricating a fin-FET device in accordance with some embodiments of the present disclosure.

The following disclosure provides many different embodiments, or embodiments, for implementing different features of the provided subject matter. Specific embodiments of components and arrangements are described below to simplify the present disclosure. These are, of course, merely embodiments and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, the method in accordance with some embodiments of the present disclosure includes the steps S10~S50. In the step S10, a gate stack and a source and drain region are formed on a substrate, in which the source and drain region is formed subsequent to the formation of the gate stack and located beside the gate stack. In the step S20, a preliminary dielectric layer is subsequently formed on the substrate and the gate stack is partially exposed by the preliminary dielectric layer. Then, in the step S30, an insulation layer is formed to cover the preliminary dielectric layer and the exposed portion of the gate stack. Subsequently, in the step S40, the insulation layer and the preliminary dielectric layer are partially removed in an etching process until exposing the source and drain region to form a sidewall insulator. Thereafter, in the step S50, a metal connector is formed to stack on the source and drain region. By performing the steps S10 to S50, a fin-FET device according to some embodiments of the present disclosure is provided, in which the metal connector used for contacting the source and drain region is isolated from the gate stack by the sidewall insulator so that the yield rate and the process window of fabricating the fin-FET device are enhanced. However, it is not limited to add one or more additional step among the above steps for fabricating the fin-FET device. In addition, for further clearly disclosing the method of fabricating a fin-FET device and the device fabricated by the method, the following paragraphs are depicted accompanying with the drawings of the device in each step.

Figure 2:
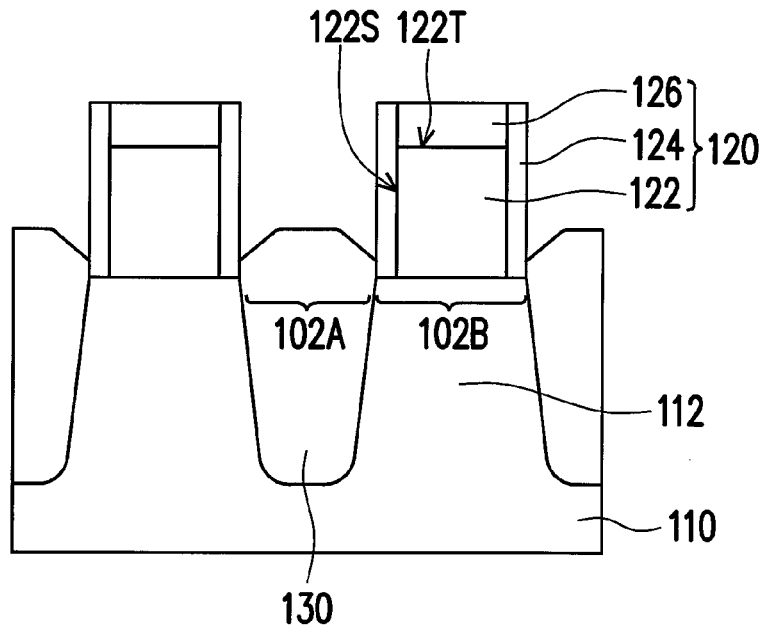
FIG. 2 schematically illustrates a device fabricated by the step S10 in FIG. 1 in accordance with some embodiments.

In FIG. 2, a substrate 110 is provided for forming a gate stack 120 and a source and drain region 130 thereon. The source and drain region 130 is located beside the gate stack 120. In some embodiments, the substrate 110 has at least one fin 112, the gate stack 120 is disposed over and around the fin 112 and the source and drain region 130 covers a portion of the fin 112 that is revealed by the gate stack 120. In FIG. 2, two gate stacks 120 are formed on the fins 112 and one source and drain region 130 is formed between the two gate stacks 120 for exemplarily showing some embodiments of a multiple gate structures sharing one strain structure. In FIG. 2, the cross section in FIG. 2 shows the gate stack 120 being located above the fin 112. However, in another cross section taken along another direction, the gate stack 120 continuously covers on the sidewalls and the top of the fin 112.

In some embodiments, the substrate 110 includes an elementary semiconductor, such as silicon or germanium in a crystalline structure; a compound semiconductor, such as silicon carbide, gallium arsenic, gallium phosphide, indium phosphide, indium arsenide, and/or indium antimonide; or combinations thereof. Alternatively, the substrate 110 includes a silicon-on-insulator (SOI) substrate. The SOI substrate may be fabricated using separation by implantation of oxygen (SIMOX), wafer bonding, and/or other suitable methods. In addition, the substrate 110 includes various doped regions and other suitable features.

The fin 112 is a structure embedded in the substrate 110 and protruded from the bulk of the substrate 110. The fin 112 is formed by a suitable process, such as a lithography and etching process. Alternatively, the fin 112 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used, which include performing double exposure (e.g., using two mask sets), forming spacers adjacent features and removing the features to form a pattern of spacers, resist freezing, and/or other suitable processes.

The gate stack 120 is formed over the substrate 110 to a suitable thickness. The gate stack 120 includes an electrode portion 122, a spacer 124 and a top isolator 126, in which the spacer 124 and the top isolator 126 cover and surround the electrode portion 122. In some embodiments, the electrode portion 122 includes a polycrystalline silicon (or polysilicon) layer. The polysilicon layer may be doped for proper conductivity. Alternatively, the polysilicon layer is not necessarily doped, for example, if a dummy gate is to be formed and later replaced by a gate replacement process. In alternative embodiments, the electrode portion 122 includes a conductive layer having a proper work function; therefore, the electrode portion 122 is also referred to as a work function layer. The work function layer includes a suitable material, such that the layer is tuned to have a proper work function for enhanced performance of the device. For example, if an N-type work function metal (N-metal) for an NMOS device is desired, Ta, TiAl, TiAlN, or TaCN, is used. In some embodiments, the work function layer includes doped conducting oxide materials. In alternative embodiments, the electrode portion 122 includes other conductive materials, such as aluminum, copper, tungsten, metal alloys, metal silicide, other suitable materials, and/or combinations thereof. In addition, the electrode portion 122 includes multiple layers. For example, the electrode portion 122 includes a work function layer and another conductive layer formed over the work function layer. In various embodiments, the electrode portion 122 is formed by chemical vapor deposition (CVD), physical vapor deposition (PVD), atomic layer deposition (ALD), high density plasma CVD (HDPCVD), plating, other suitable methods, and/or combinations thereof.

The spacer 124 covers a sidewall 122S of the electrode portion 122 and the top isolator 126 covers a top 122T of the electrode portion 122. The spacer 124 and the top isolator 126, for example, include silicon nitride. Other types of dielectric materials may also be used. For example, the spacer 124 and the top isolator 126 include silicon oxide or multiple layers of dielectric materials, such as silicon oxide and silicon nitride. In some embodiments, for preventing the electrode portion 122 from directly contacting the fin 112, a gate insulator (not shown) is formed between the fin 112 and the electrode portion 122. The gate insulator, for example, includes silicon oxide. Other types of gate insulation material may also be useful. For example, the gate insulator may be HfSiON, SiON or HfO$_2$. In some embodiments, the gate insulator may further include a work function tuning layer. For example, La$_2$O$_3$ may be provided for an n-type device while TiN/Al/TiN may be provided for a p-type device in addition to HfSiON and/or HfO$_2$.

The source and drain region 130 covers and contacts a portion of the fin 112 revealed by the gate stack 120. In some embodiments, the source and drain region 130 between two gate stacks 120 defines a shared source/drain region 102A proximate to and revealed by the gate stack 120 while the channel regions 102B are defined in the fin 112 under the two gate stacks 120. The shared source/drain region 102A is shared by the two channel regions 102B. In some embodiments, the source and drain region 130 has a lattice constant different from that of the fin 112. For example, the source and drain region 130 includes silicon germanium (SiGe), silicon germanium carbon (SiGe:C), or germanium (Ge) that provide higher hole mobility as compared to the fin 112. Alternatively, the source and drain region 130 includes Si:C, or other materials that provide higher electron mobility as compared to fin 112. The substrate 110 has a recess beside the channel region 102B and the source and drain region 130 fills the recess. In some embodiments, the fin 112 extends outwardly from the channel region 102B and the source and drain region 130 covers on the extended portion of the fin 112.

Figure 3A:
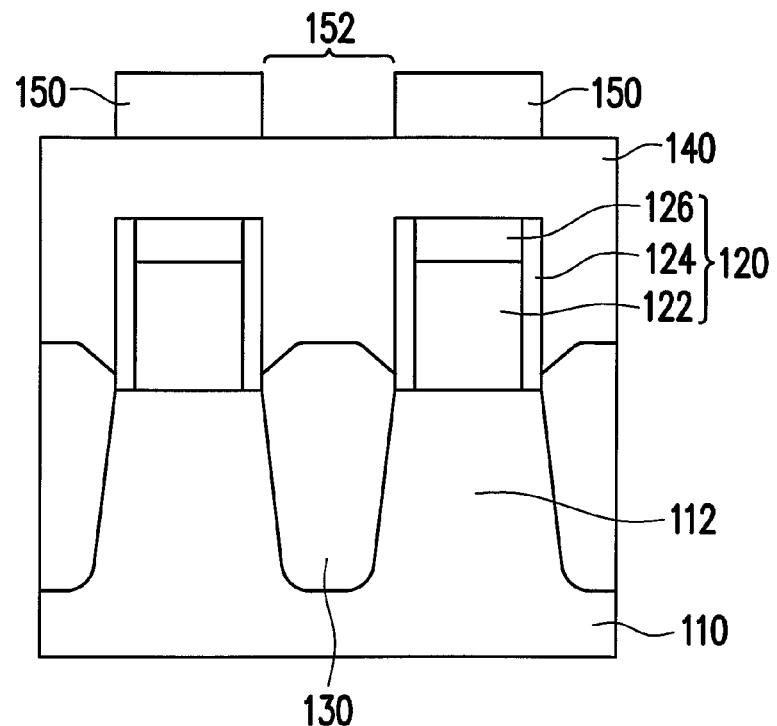
FIG. 3A and FIG. 3B schematically illustrate devices fabricated by the step S20 in FIG. 1 in accordance with some embodiments.

In FIG. 3A, a dielectric material layer 140 is formed on the substrate 110 to continuously cover the gate stack 120 and the source and drain region 130. The dielectric material layer 140, for example, includes silicon nitride or other types of dielectric materials. For example, the dielectric material layer 140 includes silicon oxide or multiple layers of dielectric materials, such as silicon oxide and silicon nitride. In addition, a photoresist pattern 150 is formed on the dielectric material layer 140 over the gate stack 120. In some embodiments, an area of the photoresist pattern 150 substantially shields an area of the gate stack 120 and an area of the opening 152 exposed by the photoresist pattern 150 shields where the source and drain region 130 is located. Then, the dielectric material layer 140 is patterned by performing an etching process using the photoresist pattern 150 as a mask and the photoresist pattern 150 is removed after the etching process. A portion of the dielectric material layer 140 in the opening 152 is partially removed and the gate stack 120 is partially exposed in the current step.

Figure 3B:
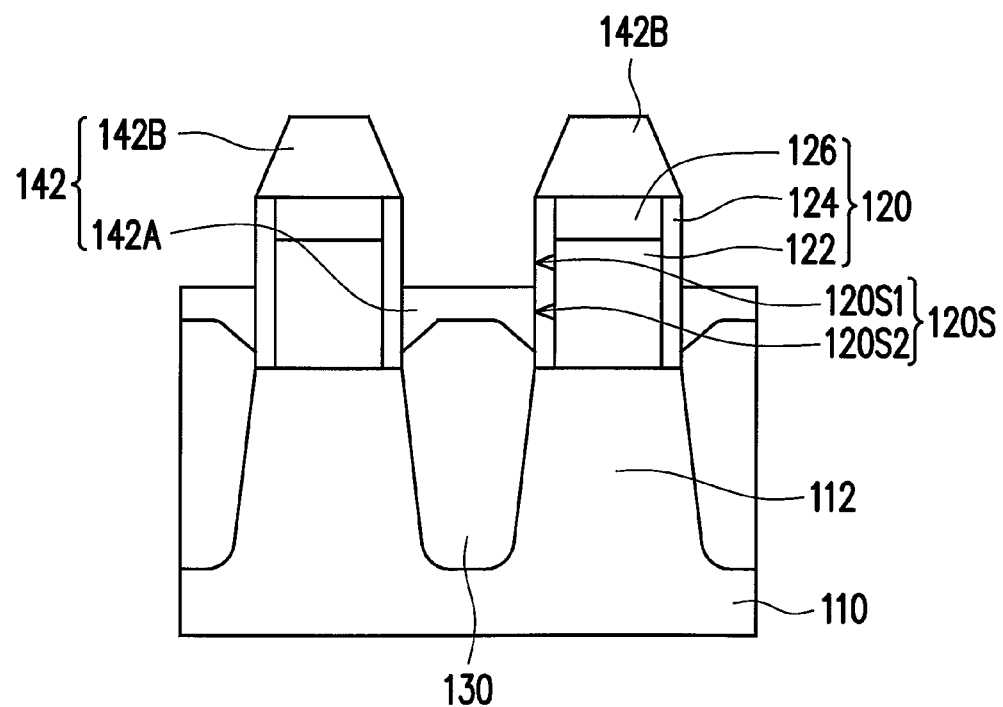

As shown in FIG. 3B, a preliminary dielectric layer 142 including a first dielectric portion 142A over the source and drain region 130 and a second dielectric portion 142B over the gate stack 120 is then formed. The first dielectric portion 142A is the portion previously being etched and the second dielectric portion 142B is the portion previously covered by the photoresist pattern 150. Under the etching process, the second dielectric portion 142B has a taper shape with a bottom area greater than a top area. In addition, the first dielectric portion 142A and the second dielectric portion 142B are separated from each other to expose a first section 120S1 of the sidewall 120S of the gate stack 120. Accordingly, the sidewall 120S of the gate stack 120 includes sections 120S1 and 120S2 connected continuously, in which the first dielectric portion 142A of the preliminary dielectric layer 142 is in contact with the second section 120S2 and the first section 120S1 is exposed in the current step.

Figure 4:
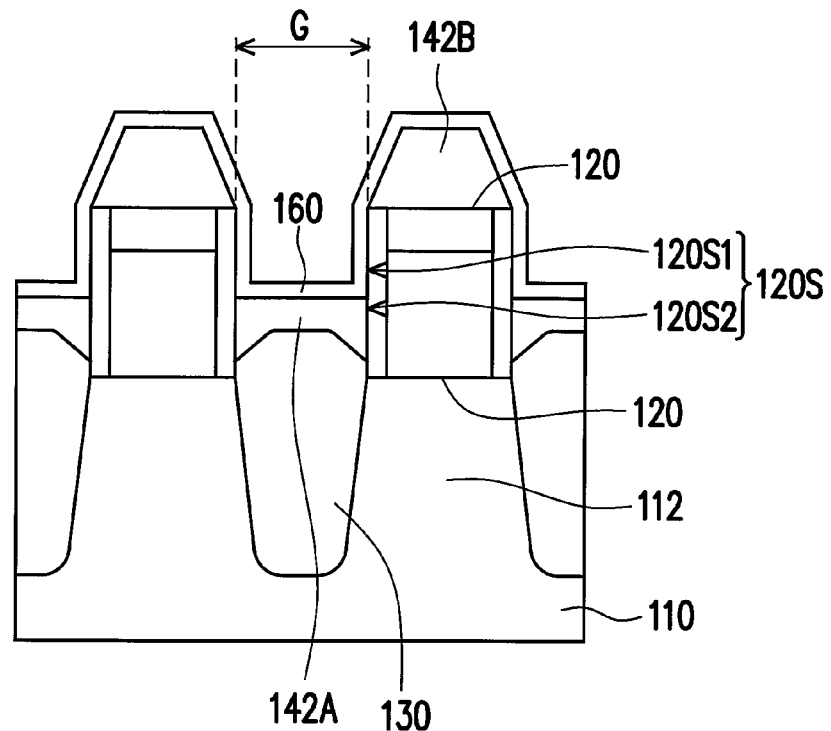
FIG. 4 schematically illustrates a device fabricated by the step S30 in FIG. 1 in accordance with some embodiments.

In FIG. 4, an insulation layer 160 is subsequently deposited on the substrate 110 to continuously cover the first dielectric portion 142A over the source and drain region 130 and the second dielectric portion 142B over the gate stack 120. The insulation layer 160 also covers the exposed portion of the gate stack 120 so that the insulation layer 160 contacts the first section 120S1 of the sidewall 120S of the gate stack 120.

In various embodiments, the insulation layer 160 is formed by atomic layer deposition (ALD), high density plasma CVD (HDPCVD), other suitable methods, or a combination thereof. The insulation layer 160, for example, includes silicon nitride, silicon oxide, silicon oxynitride, silicon carbonitride (SiCN) or multiple layers of dielectric materials, such as silicon oxide and silicon nitride. A deposition thickness of the insulation layer 160 is determined based on an essential requirement for continuously covering over the first dielectric portion 142A, the second dielectric portion 142B and the exposed first section 120S1 of the sidewall 120S of the gate stack 120. In addition, the second section 120S2 of the sidewall 120S is covered by the first dielectric portion 142A. Accordingly, the insulation layer 160 needs not cover the whole of the sidewall 120S, which facilitates to improve the sidewall coverage of the insulation layer 160 without a discontinuation of the insulation layer 160. In some embodiments, since the insulation layer 160 has good sidewall coverage, the gate stacks 120 can be arranged to be closer to each other, such that the aspect ratio of the gap region G formed between the gate stacks 120 can be enlarged, in which the aspect ratio represents a ratio of the total depth from the top of the second dielectric portion 142B to the top of the source and drain region 130 versus the distance between the two gate stack 120. Thereby, the device size can be reduced and the device density can be increased.

Figure 5:
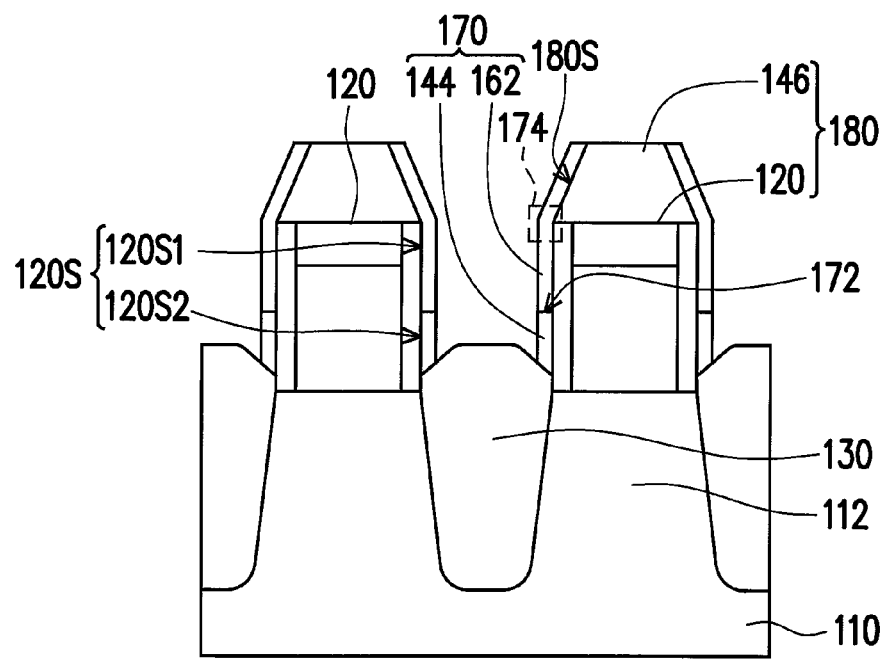
FIG. 5 schematically illustrates a device fabricated by the step S40 in FIG. 1 in accordance with some embodiments.

Thereafter, the insulation layer 160 and the preliminary dielectric layer 142 are partially removed until the source and drain region 130 is exposed in the step S40 of FIG. 1. In some embodiments, an isotropic etching is performed for partially removing the insulation layer 160 and the preliminary dielectric layer 142. In FIG. 5, a portion of the insulation layer 160 and a portion of the preliminary dielectric layer 142 are remained on the source and drain region 130 to form a sidewall insulator 170. The sidewall insulator 170 includes a bottom portion 144 patterned from the first dielectric portion 142A of the preliminary dielectric layer 142 and an upper portion 162 patterned from the insulation layer 160. The bottom portion 144 is in contact with the second section 120S2 of the sidewall 120S of the gate stack 120 while the upper portion 162 is in contact with the first section 120S1 of the sidewall 120S of the gate stack 120, namely, the sidewall insulator 170 contacts and covers the sidewall 120S of the gate stack 120 over the source and drain region 130 continuously.

In FIG. 5, the removing process is performed until the source and drain region 130 is exposed and simultaneously, the insulation layer 160 and the preliminary dielectric layer 142 over the gate stack 120 are partially removed. Accordingly, the second dielectric portion 142B in FIG. 4 is patterned to form the interlayer dielectric layer 146 that is revealed by the remained portion (the upper portion 162) of the insulation layer 160 and the interlayer dielectric layer 146 stacks on the gate stack 120 to form a stack structure 180. In addition, owing to the etching step depicted in FIG. 3B, the stack structure 180 has an oblique side surface 180S and the sidewall insulator 170 covers along the oblique side surface 180S to have a turning portion 174.

According to the above steps, the insulation layer 160 and the preliminary dielectric layer 142 are formed or deposited at different steps and thus an interface 172 is formed between the bottom portion 144 and the upper portion 162, and the bottom portion 144 is located between the upper portion 162 and the source and drain region 130. In addition, the insulation layer 160 and the preliminary dielectric layer 142 are formed after the formation of the source and drain region 130 so that the sidewall 120S of the gate stack 120 is continuously covered by the bottom portion 144 of the sidewall insulator 170 and the upper portion 162 of the sidewall insulator 170. Furthermore, the bottom portion 144 of the sidewall insulator 170 and the interlayer dielectric layer 146 are made from the dielectric material layer 140 and thus include the same material.

Figure 6:
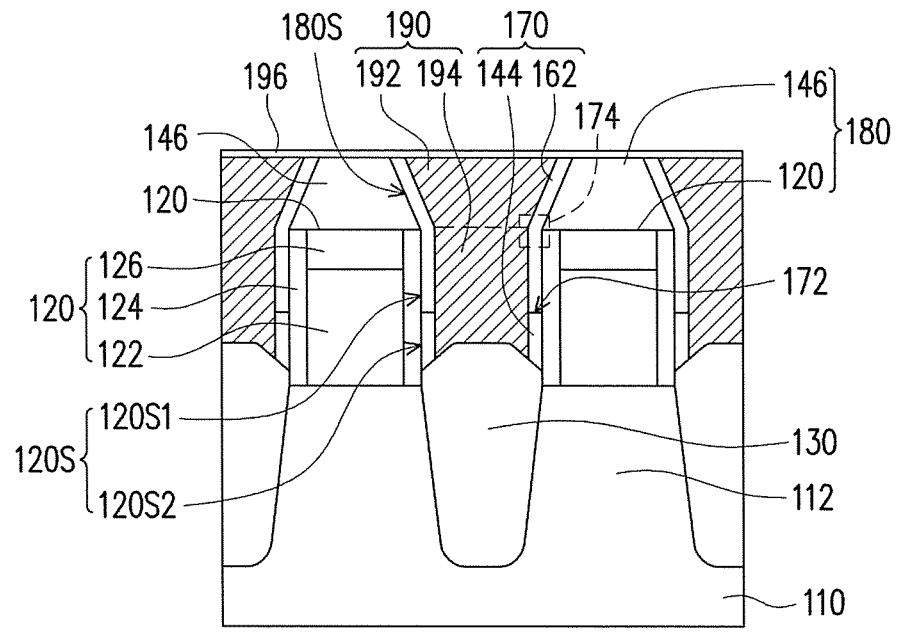
FIG. 6 schematically illustrates a device fabricated by the step S50 in FIG. 1 in accordance with some embodiments.

In FIG. 6, a fin-FET device 100 is formed by forming a metal connector 190 in the device of FIG. 5. As shown in FIG. 6, the metal connector 190 is intended to represent any type of conductive materials and structures that is employed to establish electrical connections to the source and drain region 130. The metal connector 190 includes a single layer of conductive material or multiple layers of conductive material. In some embodiments, the metal connector 190 includes tungsten, copper, the alloys thereof or any metal material with suitable resistance and gap-fill capability. The metal connector 190 stacks on the source and drain region 130 while the sidewall insulator 170 is located between the metal connector 190 and the gate stack 120. Accordingly, the metal connector 190 and the gate stack 120 are isolated from each other, which prevents an unwanted electric connection between the metal connector 190 and the gate stack 120 and thus improve the yield rate and the process window of fabricating the metal connector 190. After the formation of the metal connector 190, a planarization process is optionally performed so that the top of the metal connector 190 and the top of the sidewall insulator 170 as well as the top of the stack structure 180 are coplanar. Furthermore, a cap layer 196 is formed on the metal connector 190 and the stack structure 180 to serve as an etching stop layer and the material of the cap layer 196 includes nitride. In some embodiments, the planarization process includes one or more Chemical-Mechanical Polishing (CMP) processes.

In FIG. 6, the fin-FET device 100 includes a substrate 110, multiple stack structures 180, a source and drain region 130, a metal connector 190, and the sidewall insulators 170. The stack structure 180 includes a gate stack 120 and an interlayer dielectric layer 146 stacking thereon. The gate stack 120 is disposed over a fin 112 embedded in the substrate 110 and the source and drain region 130 covers a portion of the fin 112 revealed by the gate stack 120. The metal connector 190 stacks on the source and drain region 130. The sidewall insulators 170 is disposed between the metal connector 190 and the stack structure 180 and disposed on the source and drain region 130. The sidewall insulator 170 includes a bottom portion 144 and an upper portion 162 with an interface 172 therebetween.

The first section 120S1 of the sidewall 120S of the gate stack 120 is in contact with the upper portion 162 of the sidewall insulator 170, and the second section 120S2 of the sidewall 120S of the gate stack 120 is in contact with the bottom portion 144 of the sidewall insulator 170. In other words, the sidewall 120S of the gate stack 120 over the source and drain region 130 is continuously covered by the sidewall insulator 170. Accordingly, the electrode portion 122 of the gate stack 120 is isolated from the metal connector 190 by the sidewall insulator 170 besides the spacer 124 while is isolated from the source and drain region 130 by the spacer 124.

The stack structure 180 formed by the interlayer dielectric layer 146 stacking on the gate stack 120 has a taper top portion which is formed by the etching process depicted in FIG. 3B and provides the oblique side surface 180S. The sidewall insulator 170 covers along the oblique side surface 180S to have a turning portion 174. In addition, the metal connector 190 between the stack structures 180 includes an expansion portion 192 and a thin portion 194 between the expansion portion 192 and the source and drain region 130, wherein an area of the expansion portion 192 exceeds an area of the thin portion 194, such that the metal connector 190 provides an enlarged area for contacting an external component. As described in above, the sidewall insulator 170 continuously covers the sidewall of the stack structure 180 when the gate stacks 120 are closer to each other. Therefore, the metal connector 190 formed between the gate stacks 120 has high aspect ratio without an unwanted electric connection to the electrode portion 122 of the gate stack 120. In other words, the yield rate and the process window of fabricating the metal connector 190 are improved.

Figure 7:
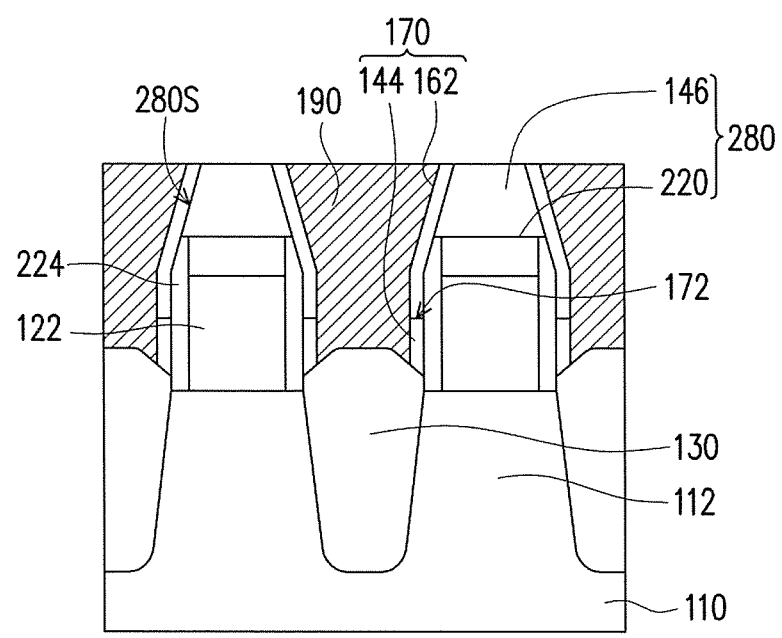
FIG. 7 schematically illustrates a cross section of a fin-FET device in accordance with alternative embodiments of the present disclosure.

In FIG. 7, a fin-FET device 200 is made by performing the steps S10 to S50 depicted in FIG. 1 and the fabrication method of the fin-FET device 200 refers to the above embodiments and drawings. The fin-FET device 200 includes a substrate 110, a stack structure 280, a source and drain region 130, a metal connector 190 and a sidewall insulator 170. The stack structure 280 includes a gate stack 220 and an interlayer dielectric layer 146 stacking on the gate stack 220. The gate stack 220 is disposed over and around a fin 112 embedded in the substrate 110. The source and drain region 130 is disposed on a portion of the fin 112 revealed by the gate stack 220. The metal connector 190 stacks on the source and drain region 130 and is isolated from the gate stack 220 by the sidewall insulator 170. The stack structure 280 has an oblique side surface 280S which is formed at the step S20 depicted in FIG. 3A and FIG. 3B. The gate stack 220 is partially etched at the step S20 depicted in FIG. 3B, such that the oblique side surface 280S extends to the upper portion of the gate stack 220. The spacer 224 of the gate stack 220 has a taper top portion proximate to the interlayer dielectric layer 146. In the some embodiments, the oblique side surface 280S extends to the upper portion of the gate stack 220, and the sidewall insulator 170 continuously covers the oblique side surface 280S of the stack structure 280 so that the electrical isolation between the metal connector 190 and the gate stack 220 is ensured by disposing the sidewall insulator 170.

The fin-FET device 100 or 200 illustrates an integrated circuit, or portion thereof. In some embodiments, the fin-FET device 100 or 200 comprises active devices such as metal-oxide-fin-FET field effect transistors (MOSFETs), complementary metal-oxide-fin-FET (CMOS) transistors, high voltage transistors, and/or high frequency transistors; other suitable components; and/or combinations thereof. In some embodiments, the fin-FET device 100 or 200 additionally includes passive components, such as resistors, capacitors, inductors, and/or fuses. In some embodiments, the fin-FET device 100 or 200 is formed by CMOS technology processing, and thus some processes are not described in detail herein. In some embodiments, additional steps are provided before, during, and after the method depicted in FIG. 1, and some of the steps described above may be replaced or eliminated, for additional embodiments of the method. In some embodiments, additional features are added in the fin-FET device 100 or 200, and some of the features described below are replaced or eliminated, for additional embodiments of the fin-FET device 100 or 200.

In accordance with some embodiments of the present disclosure, a fin-FET device includes a substrate, a stack structure, a source and drain region, a sidewall insulator and a metal connector. The substrate has a fin embedded therein. The stack structure including a gate stack is disposed over the fin. The source and drain region is disposed beside the stack structure. The sidewall insulator is disposed on the source and drain region. The sidewall insulator includes a bottom portion and an upper portion. An interface is formed between the bottom portion and the upper portion and the bottom portion is located between the upper portion and the source and drain region. The metal connector stacks on the source and drain region and the sidewall insulator is located between the metal connector and the stack structure.

In accordance with alternative embodiments of the present disclosure, a fin-FET device includes a substrate having a fin, a stack structure, a source and drain region, a metal connector, and a sidewall insulator. The stack structure includes a gate stack disposed over the fin. The gate stack has a sidewall including a first section and a second section connected continuously. The source and drain region covers a portion of the fin revealed by the gate stack. The metal connector stacks on the source and drain region. The sidewall insulator is disposed on the source and drain region and located between the metal connector and the stack structure. The sidewall insulator includes an upper portion and a bottom portion between the upper portion and the source and drain region. The upper portion and the bottom portion respectively cover the first section and the second section.

In accordance with further alternative embodiments of the present disclosure, a method of fabricating includes at least the following steps. A gate stack is formed over a fin of a substrate and subsequently a source and drain region is formed to cover a portion of the fin revealed by the gate stack. A preliminary dielectric layer is formed on the substrate over the gate stack and the source and drain region. The gate stack is partially exposed by the preliminary dielectric layer. An insulation layer is formed to continuously cover the preliminary dielectric layer and an exposed portion of the gate stack. The insulation layer and the preliminary dielectric layer are partially removed until the source and drain region is exposed, in which a portion of the insulation layer and a portion of the preliminary dielectric layer are remained to form a sidewall insulator on the source and drain region. A metal connector is formed on the source and drain region, in which the metal connector is isolated from the gate stack by the sidewall insulator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a Fin-FET device, comprising:
   forming a gate stack on a fin of a substrate;
   forming a source and drain region beside the gate stack;
   forming a preliminary dielectric layer on the substrate over the gate stack and the source and drain region, and the preliminary dielectric layer partially exposing the gate stack, wherein the forming of the preliminary dielectric layer comprises forming a dielectric material layer continuously covering the gate stack and the source and drain region, and patterning the dielectric material layer into the preliminary dielectric layer comprising a first dielectric portion over the source and drain region and a second dielectric portion over the gate stack;
   forming an insulation layer to continuously cover the preliminary dielectric layer and an exposed portion of the gate stack;
   partially removing the insulation layer and the preliminary dielectric layer until exposing the source and drain region and remaining a portion of the insulation layer and a portion of the preliminary dielectric layer at a sidewall of the gate stack to serve as a sidewall insulator on the source and drain region; and
   forming a metal connector on the source and drain region and the metal connector being isolated from the gate stack by the sidewall insulator.

2. The method according to claim 1, wherein the partially removing of the insulation layer and the preliminary dielectric layer further exposes the second dielectric portion to form an interlayer dielectric layer stacking on the gate stack.

3. The method according to claim 1, further comprising performing a planarization process on the metal connector and the sidewall insulator.

4. The method according to claim 3, wherein the planarization process comprises a Chemical-Mechanical Polishing process.

5. The method according to claim 1, further comprising forming a cap layer on the metal connector and the gate stack.

6. A method of fabricating a Fin-FET device, comprising:
forming a gate stack on a fin of a substrate;
forming a source and drain region beside the gate stack;
forming a dielectric material layer continuously covering the gate stack and the source and drain region;
patterning the dielectric material layer into a preliminary dielectric layer comprising a first dielectric portion over the source and drain region and a second dielectric portion over the gate stack, separating the first dielectric portion and the second dielectric portion from each other and exposing a section of a sidewall of the gate stack;
forming an insulation layer to continuously cover the preliminary dielectric layer and the section of the sidewall of the gate stack;
partially removing the insulation layer and the preliminary dielectric layer until exposing the source and drain region and remaining a portion of the first dielectric portion on the source and drain region and a portion of the insulation layer at the section of the sidewall of the gate stack and on the portion of the first dielectric portion to serve as a sidewall insulator on the source and drain region; and
forming a metal connector on the source and drain region and the metal connector being isolated from the gate stack by the sidewall insulator.

7. The method according to claim 6, wherein the partially removing of the insulation layer and the preliminary dielectric layer comprises removing the insulation layer to expose the second dielectric portion to form an interlayer dielectric layer stacking on the gate stack.

8. The method according to claim 6, further comprising performing a planarization process on the metal connector and the sidewall insulator.

9. The method according to claim 8, wherein the planarization process comprises a Chemical-Mechanical Polishing process.

10. The method according to claim 6, further comprising forming a cap layer on the metal connector and the gate stack.

11. A Fin-FET device, comprising:
a substrate having a fin;
a stack structure comprising a gate stack disposed on the fin of the substrate, wherein the gate stack has a sidewall;
a source and drain region beside the gate stack;
metal connectors disposed on the source and drain region; and
a sidewall insulator disposed on the source and drain region and located between the metal connector and the stack structure, wherein the sidewall insulator comprises a first insulator disposed on the source and drain region and a second insulator disposed on a top surface of the first insulator,
wherein the stack structure has an oblique side surface arranged obliquely with respect to the sidewall of the gate stack, the sidewall of the gate stack is between the oblique surface and the fin, and the sidewall insulator covers the stack structure along the sidewall of the gate stack and the oblique side surface to have a turning portion.

12. The Fin-FET device according to claim 11, wherein the stack structure further comprises an interlayer dielectric layer stacking on the gate stack.

13. The Fin-FET device according to claim 12, wherein the interlayer dielectric layer and the first insulator of the sidewall insulator comprise a same material.

14. The Fin-FET device according to claim 12, wherein the sidewall insulator is further located between the metal connector and the interlayer dielectric layer.

15. The Fin-FET device according to claim 12, wherein the gate stack comprises an electrode portion, a spacer covering a sidewall of the electrode portion and a top isolator over a top of the electrode portion, the spacer is located between the electrode portion and the sidewall insulator and between the electrode portion and the source and drain region.

16. The Fin-FET device according to claim 15, wherein the spacer of the gate stack has a taper top portion proximate to the interlayer dielectric layer.

17. The Fin-FET device according to claim 11, wherein the metal connector comprising an expansion portion and a thin portion between the expansion portion and the source and drain region, and an area of the expansion portion exceeds an area of the thin portion.

18. The Fin-FET device according to claim 11, further comprising a cap layer on the metal connector and on the stack structure.

* * * * *